(12) United States Patent
Costantini

(10) Patent No.: US 11,777,455 B2
(45) Date of Patent: Oct. 3, 2023

(54) INTEGRATED CIRCUIT AMPLIFIER AND THERMAL PROTECTION CIRCUITRY

(71) Applicant: Qorvo US, Inc., Greensboro, NC (US)

(72) Inventor: Alberto Costantini, Phoenix, AZ (US)

(73) Assignee: Qorvo US, Inc., Greensboro, NC (US)

( * ) Notice: Subject to any disclaimer, the term of this patent is extended or adjusted under 35 U.S.C. 154(b) by 371 days.

(21) Appl. No.: 17/223,083

(22) Filed: Apr. 6, 2021

(65) Prior Publication Data
US 2022/0321065 A1    Oct. 6, 2022

(51) Int. Cl.
*H03F 1/52*    (2006.01)
*H03F 3/195*   (2006.01)

(52) U.S. Cl.
CPC ............. *H03F 1/52* (2013.01); *H03F 3/195* (2013.01); *H03F 2200/447* (2013.01); *H03F 2200/451* (2013.01)

(58) Field of Classification Search
CPC ........................................................ H03F 1/52
USPC ..................................... 330/298, 289, 285
See application file for complete search history.

(56) References Cited

U.S. PATENT DOCUMENTS

| | | | | |
|---|---|---|---|---|
| 5,331,291 A * | 7/1994 | D'Agostino | .......... | H03F 1/0261 330/289 |
| 5,640,059 A * | 6/1997 | Kammiller | ................ | B60L 3/04 307/64 |
| 6,927,626 B2 * | 8/2005 | Stanley | ................. | H03F 3/3076 330/207 P |
| 7,348,854 B1 * | 3/2008 | Mordkovich | ........... | H03F 3/193 330/285 |
| 8,508,300 B2 * | 8/2013 | Lee | ....................... | H03G 3/3005 330/289 |
| 2010/0148799 A1 * | 6/2010 | Hardie | ............... | H03K 17/9512 324/654 |
| 2013/0077796 A1 * | 3/2013 | Risbo | ..................... | H04R 3/007 381/55 |

OTHER PUBLICATIONS

Chou, Y.C., and R. Ferro. "V. Heterojunction Bipolar Transistors," accessed Mar. 29, 2021, from https://parts.jpl.nasa.gov/mmic/3-V.PDF.

(Continued)

*Primary Examiner* — Henry Choe
(74) *Attorney, Agent, or Firm* — Withrow & Terranova, P.L.L.C.

(57) ABSTRACT

Disclosed is an integrated circuit amplifier having a power transistor with a signal/bias input terminal, a first high current terminal, and a second high current terminal, and thermal protection circuitry with a sensor transistor having a sensor control terminal, a sensor output terminal, and a sensor current terminal coupled to a fixed voltage node. Sensor bias circuitry includes a sensor bias terminal coupled to the sensor control terminal, wherein the sensor bias circuitry is configured to generate a temperature set point at which a sensor output voltage at the sensor output terminal drops at least 50% when the temperature of the sensor transistor is above the temperature set point. Shutdown circuitry coupled between the sensor output terminal and the signal/bias input terminal is configured to reduce a bias signal at the signal/bias terminal in response to the at least 50% drop in sensor output voltage.

22 Claims, 4 Drawing Sheets

(56) References Cited

OTHER PUBLICATIONS

Golovins, E., and S. Sinha. "Analytical Approach to Design of Proportional-to-the-Absolute-Temperature Current Sources and Temperature Sensors Based on Heterojunction Bipolar Transistors," IEEE Transactions on Components, Packaging and Manufacturing Technology, vol. 3, No. 2, Feb. 2013, pp. 262-274 (manuscript).

* cited by examiner

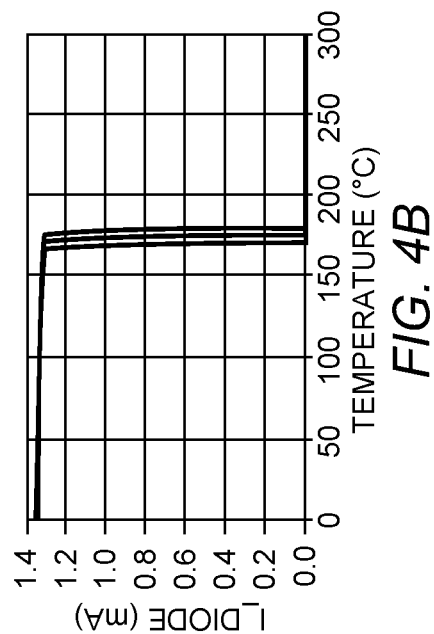
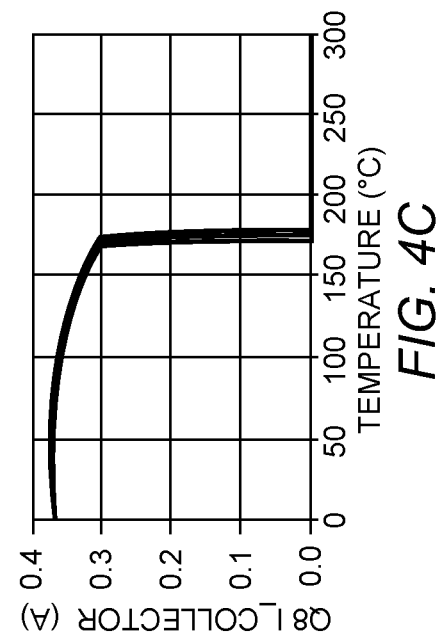
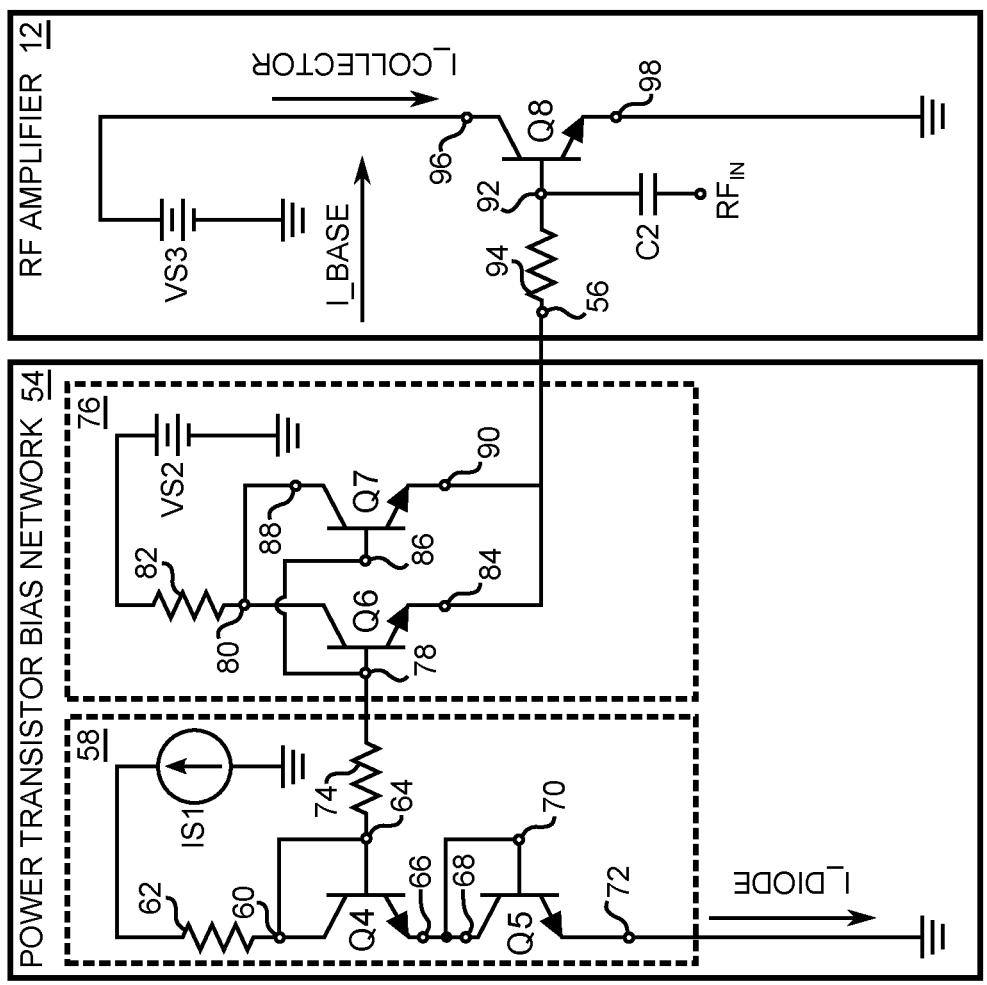
FIG. 4A
FIG. 4B
FIG. 4C

INTEGRATED CIRCUIT AMPLIFIER AND THERMAL PROTECTION CIRCUITRY

FIELD OF THE DISCLOSURE

The present disclosure relates to thermal protection circuitry for preventing thermal damage to a thermally stressed circuitry such as a power amplifier.

BACKGROUND

Thermal protection for thermally stressed circuitry such as a power amplifier is becoming increasingly necessary due to possible unintended operation in the application, for example, higher duty-cycle operation at high power conditions that are beyond the typical designed operation, and higher temperature operation than specified when application board design is not optimized for thermal performance. Typically, active thermal protection requires complicated circuitry that requires sensor calibration to operate properly. Calibration of sensors integrated within complicated circuitry places unwanted burdens on both the manufacturer and customer. As such, there remains a need for thermal protection circuitry that requires no sensor calibration and that is relatively uncomplicated.

SUMMARY

Disclosed is an integrated circuit amplifier having a power transistor with a signal/bias input terminal, a first high current terminal, and a second high current terminal, and thermal protection circuitry with a sensor transistor having a sensor control terminal, a sensor output terminal, and a sensor current terminal coupled to a fixed voltage node. Sensor bias circuitry includes a sensor bias terminal coupled to the sensor control terminal, wherein the sensor bias circuitry is configured to generate a temperature set point at which a sensor output voltage at the sensor output terminal drops at least 50% when the temperature of the sensor transistor is above the temperature set point. Shutdown circuitry coupled between the sensor output terminal and the signal/bias input terminal is configured to reduce a bias signal at the signal/bias terminal of the power transistor in response to the at least 50% drop in sensor output voltage.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 4A is a partial schematic showing a power transistor bias network and the RF amplifier current labels indicating the locations of currents that are simulated over swept temperature ranges.

FIG. 4B is a plot of diode current associated with the bias diode stack circuit versus temperature.

FIG. 4C is a plot of collector current of a power transistor of the RF amplifier versus temperature.

DETAILED DESCRIPTION

Figure 1:
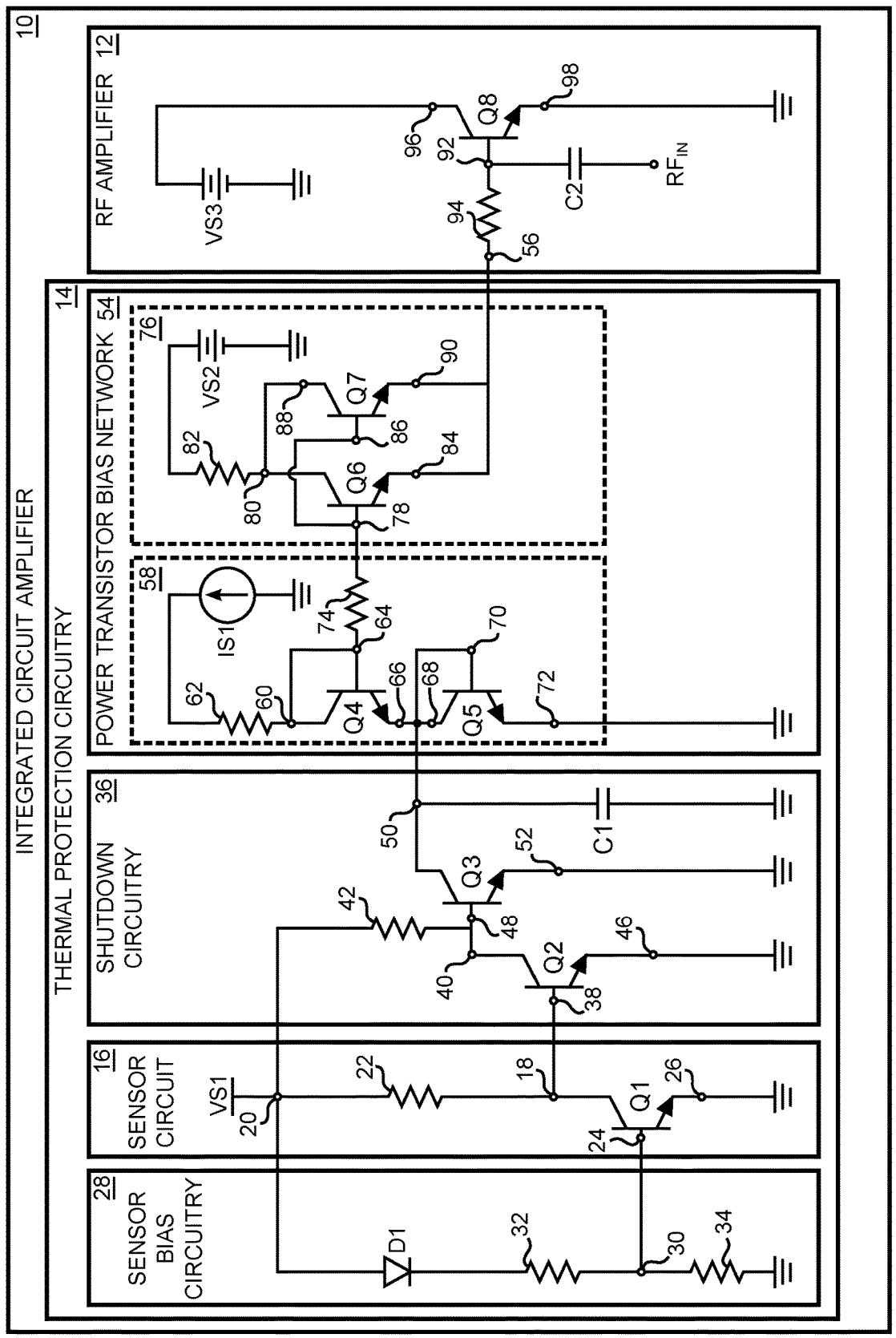
FIG. 1 is a schematic of an exemplary integrated circuit amplifier having a radio frequency (RF) amplifier with on-chip thermal protection circuitry that is configured to protect the RF amplifier from thermal damage.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 is a schematic of an integrated circuit amplifier 10 having a radio frequency (RF) amplifier 12 and thermal protection circuitry 14 that is configured to protect the RF amplifier 12 during a thermal overstress event. The thermal protection circuitry 14 includes a sensor circuit 16 having a sensor transistor Q1 with a sensor output terminal 18 that is coupled a first voltage source terminal 20 through a sensor output resistor 22. The first voltage source terminal 20 is typically coupled to a first voltage source VS1.

The sensor transistor Q1 has a sensor control terminal 24, and a sensor current terminal 26 that is coupled to a fixed voltage node such as ground. The thermal protection circuitry 14 further includes sensor bias circuitry 28 having a sensor bias terminal 30 coupled to the sensor control terminal 24. The sensor bias circuitry 28 is configured to generate a temperature set point at which a sensor output voltage at the sensor output terminal 18 drops at least 50% when the temperature of the sensor transistor Q1 is above the temperature set point. Current flowing through the sensor resistor 22 provides the drop in the sensor output voltage at the sensor output terminal 18. In at least one embodiment, the sensor output voltage drops 2 V±25% when the temperature of the sensor transistor Q1 is above the temperature set point.

In the exemplary embodiment depicted in FIG. 1, the sensor bias circuitry 28 has a first sensor bias resistor 32 coupled between the first source voltage terminal 20 and the sensor bias terminal 30 and a second sensor bias resistor 34 coupled between the sensor bias terminal 30 and the fixed voltage node. A resistance ratio between first sensor bias resistor 32 and the second sensor bias resistor 34 establishes the temperature set point at which the thermal protect circuitry 14 becomes fully engaged in protecting the RF amplifier 12. Adjustment of the resistance ratio enables shifting the temperature set point to the desired temperature, for example, from 200° C. to 225° C. to 250° C. A diode D1 is coupled in series with the first sensor bias resistor 32, wherein the diode D1 is oriented to conduct current from the voltage source terminal 20 to the sensor bias terminal 30. The diode D1 is configured to provide beta compensation for the sensor transistor Q1.

Shutdown circuitry 36 is configured to reduce a bias signal that provides bias to the RF amplifier 12 in response to an at least 50% drop in sensor output voltage at the sensor output terminal 18. The shutdown circuitry 36 includes a logic inverter transistor Q2 having a logic control terminal 38 coupled to the sensor output terminal 18, a first inverter current terminal 40 coupled to the first voltage source terminal 20 through a logic resistor 42, and a second inverter current terminal 46 coupled to the fixed voltage node.

The shutdown circuitry 36 further includes a pull-down transistor Q3 having a pull-down control terminal 48 coupled to the first inverter current terminal 40, a first pull-down current terminal 50, and a second pull-down current terminal 52 coupled to the fixed voltage node. A first capacitor C1 configured to filter noise is coupled from the first pull-down current terminal 50 to the fixed voltage node.

The thermal protection circuitry 14 further includes a power transistor bias network 54 coupled between the shutdown circuitry 36 and a bias input terminal 56 of the RF amplifier 12. The power transistor bias network 54 includes a bias diode stack circuit 58 having a first power bias transistor Q4 having a first bias current terminal 60 coupled to a current source IS1 through a power bias resistor 62, a first bias control terminal 64 coupled to the first bias current terminal 60, and a second bias current terminal 66, and a second power bias transistor Q5 having a third bias current terminal 68 coupled to the second bias current terminal 66, a second bias control terminal 70 coupled to the third bias current terminal 68, and a fourth bias current terminal 72 coupled to the fixed voltage node. A coupling resistor 74 couples the bias diode stack circuit 58 to a bias drive circuit 76.

In the exemplary embodiment of FIG. 1, the bias drive circuit 76 has a first bias driver transistor Q6 having a first driver control terminal 78 coupled to the coupling resistor 74, a first driver current terminal 80 coupled to a second voltage source VS2 through a bias driver resistor 82, and a second driver current terminal 84. A second bias driver transistor Q7 has a second driver control terminal 86 coupled to the first driver control terminal 78, a third driver current terminal 88 is coupled to the second voltage source VS2 through the bias driver resistor 82, and a fourth driver current terminal 90 is coupled to both the second driver current terminal 84 and the bias input terminal 56 that couples to an amplifier control terminal 92 of a power transistor Q8 that is the active RF device of the RF amplifier 12. A radio frequency signal input terminal $RF_{IN}$ is coupled to the amplifier control terminal 92 through a coupling capacitor C2. The power transistor Q8 has a first amplifier current terminal 96 coupled to a third voltage source VS3 and a second amplifier current terminal 98 that is coupled to the fixed voltage node. It is to be understood that the first voltage source VS1, the second voltage source VS2, and the third voltage source VS3 may be replaced by a single voltage source in some embodiments.

In a realization of the integrated circuit amplifier 10, the sensor transistor Q1 is located close to the power transistor Q8 so that the temperature of the sensor transistor Q1 is substantially the same as the temperature of the power transistor Q8. Moreover, the physical size of the sensor transistor Q1 may be several orders of magnitude smaller than that of the power transistor Q8. In an exemplary embodiment, the sensor transistor Q1 is a heterojunction bipolar transistor.

During operation, the overhead of the thermal protection circuitry 14 in terms of current consumption is minimal. Optimizing the values for current consumption, the thermal sensor consumes <0.5 mA under conditions of no thermal stress and <2 mA when the thermal protect circuitry 14 is fully engaged in protecting the RF amplifier 12. Current consumption can be further reduced by correct sizing of resistors.

Figure 2B:
FIG. 2B is a plot of sensor transistor base voltage versus temperature.
Figure 2C:
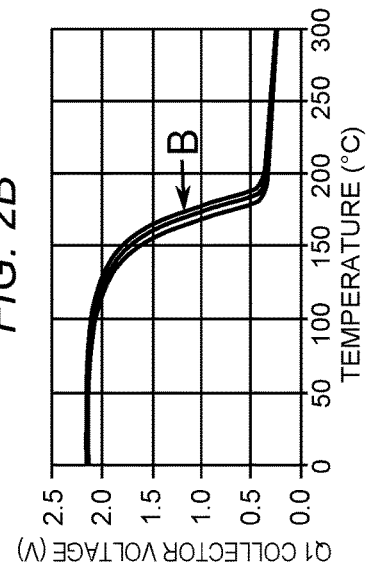
FIG. 2C is a plot of sensor transistor collector voltage versus temperature.
Figure 2D:
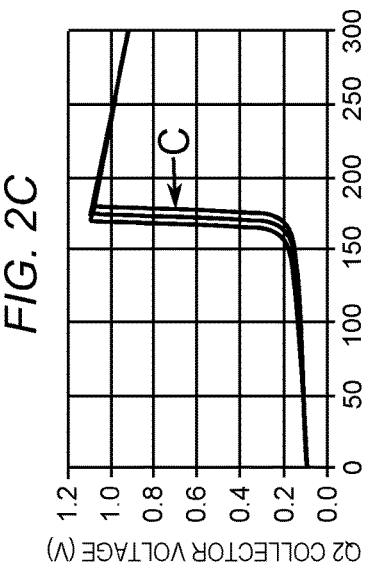
FIG. 2D is a plot of logic transistor collector voltage versus temperature.
Figure 2A:
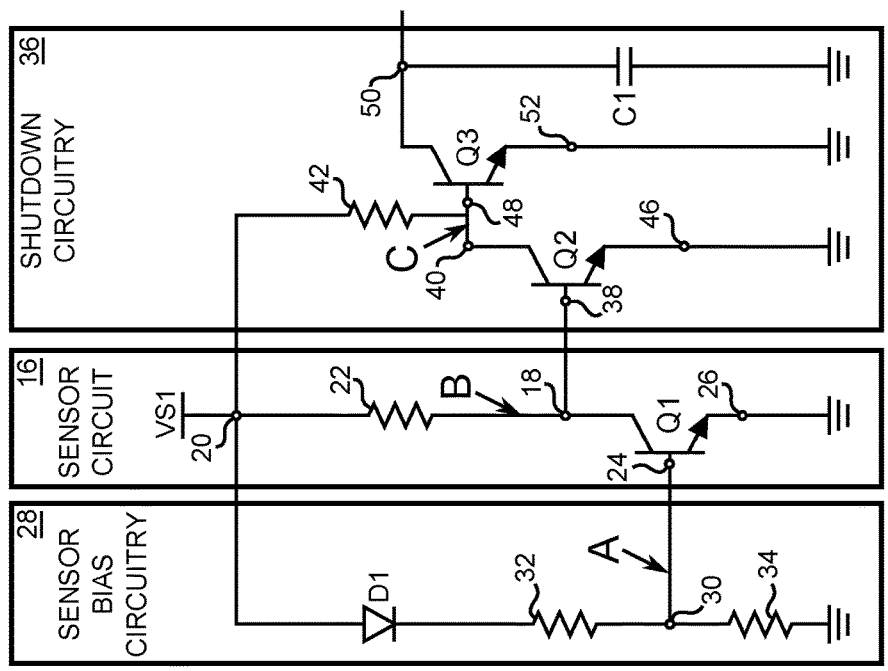
FIG. 2A is a partial schematic showing sensor bias circuitry, a sensor circuit, and shutdown circuitry with voltage labels indicating the locations of base and collector voltages that are simulated over swept temperature ranges.

FIG. 2A is a partial schematic from FIG. 1 showing the sensor bias circuitry 28, the sensor circuit 16, and the shutdown circuitry 36 with voltage labels indicating the locations of base and collector voltages that are simulated over swept temperature ranges. FIG. 2B is a plot of sensor transistor Q1 base voltage versus temperature. FIG. 2C is a plot of sensor transistor Q1 collector voltage versus temperature. FIG. 2D is a plot of logic transistor Q2 collector voltage versus temperature.

Figure 3B:
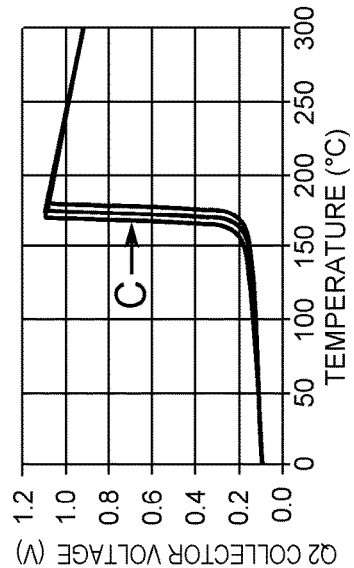
FIG. 3B is a plot of logic transistor collector voltage versus temperature.
Figure 3C:
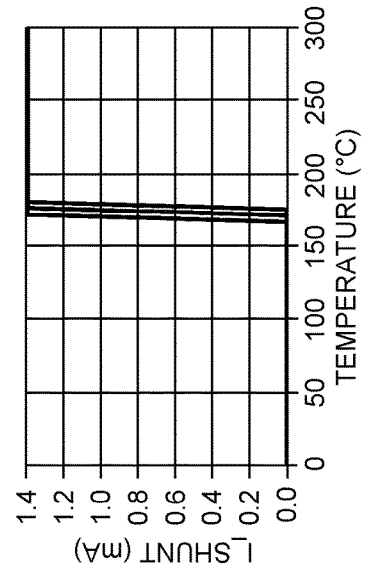
FIG. 3C is a plot of shutdown circuitry current shunting away from the bias diode stack circuit versus temperature.
Figure 3D:
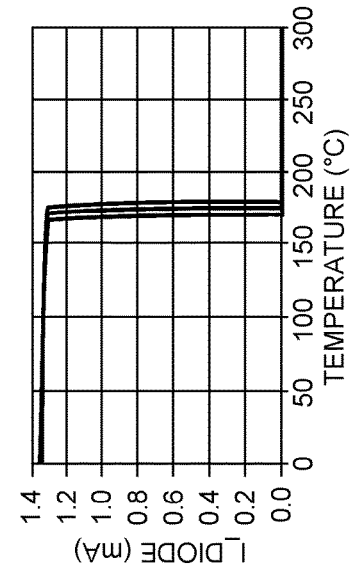
FIG. 3D is a plot of diode current associated with the bias diode stack circuit versus temperature.
Figure 3A:
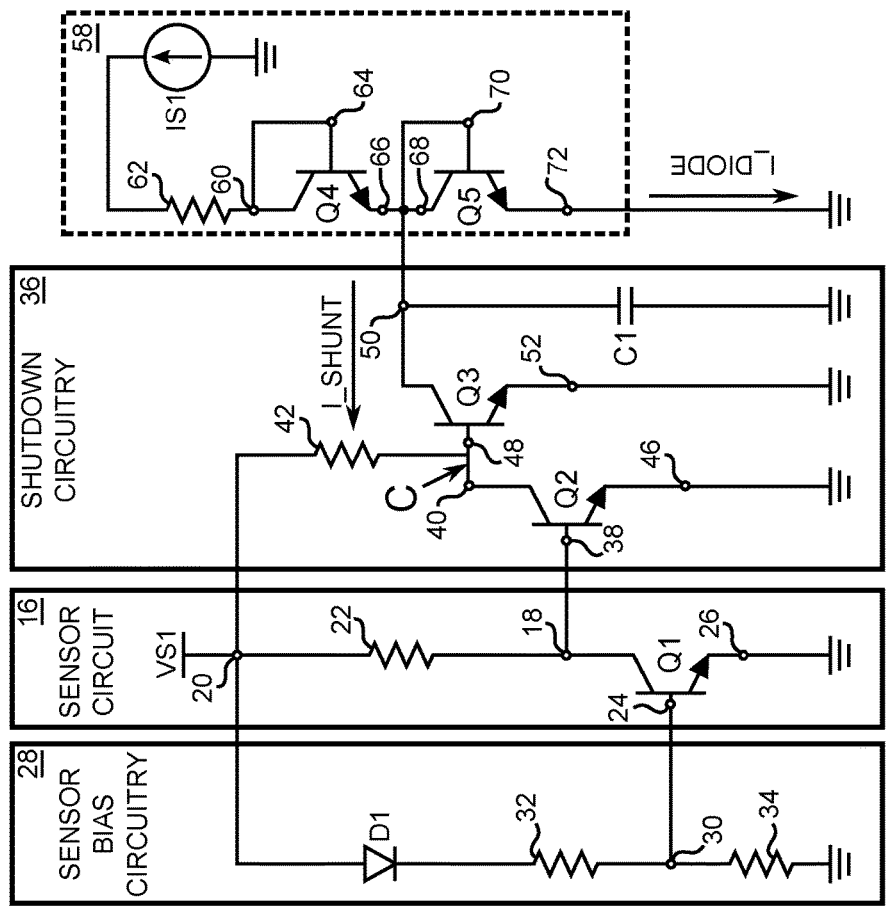
FIG. 3A is a partial schematic showing the sensor bias circuitry, the sensor circuit, the shutdown circuitry, and a bias diode stack circuit with voltage and current labels indicating the locations of collector voltage and current that are simulated over swept temperature ranges.

FIG. 3A is a partial schematic from FIG. 1 showing the sensor bias circuitry 28, the sensor circuit 16, the shutdown circuitry 36, and the bias diode stack circuit 58 with voltage and current labels indicating the locations of collector voltage and current that are simulated over swept temperature ranges. FIG. 3B is a plot of logic transistor Q2 collector voltage versus temperature. FIG. 3C is a plot of shutdown circuitry current shunting away from the bias diode stack circuit 58 versus temperature. FIG. 3D is a plot of diode current associated with the bias diode stack circuit 58 versus temperature. It is to be understood that the sensor bias circuitry 28 is only one example. The shutdown of the power transistor Q8 can be applied to a bias circuit with one reference diode, so the example is not exclusive.

FIG. 4A is a partial schematic from FIG. 1 showing the power transistor bias network 54 and the RF amplifier 12 with current labels indicating the locations of currents that are simulated over swept temperature ranges. FIG. 4B is a plot of diode current associated with the bias diode stack circuit 58 versus temperature. FIG. 4C is a plot of collector current (I_COLLECTOR) of the power transistor Q8 of the RF amplifier 12 versus temperature.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An integrated circuit amplifier comprising:
   a power transistor having a signal/bias input terminal, a first high current terminal, and a second high current terminal; and
   thermal protection circuitry comprising:
      a sensor transistor having a sensor control terminal, a sensor output terminal, and a sensor current terminal coupled to a fixed voltage node;
      sensor bias circuitry having a sensor bias terminal coupled to the sensor control terminal, wherein the sensor bias circuitry is configured to generate a temperature set point at which a sensor output voltage at the sensor output terminal drops at least 50% when the temperature of the sensor transistor is above the temperature set point; and
      shutdown circuitry coupled between the sensor output terminal and the signal/bias input terminal, wherein the shutdown circuitry is configured to reduce a bias signal at the signal/bias terminal in response to the at least 50% drop in the sensor output voltage.

2. The integrated circuit amplifier of claim 1 further comprising a sensor resistor coupled between the sensor output terminal and a voltage source terminal.

3. The integrated circuit amplifier of claim 1 wherein the sensor transistor is a heterojunction bipolar transistor.

4. The integrated circuit amplifier of claim 1 wherein the sensor bias circuitry comprises:
   a first sensor bias resistor coupled between the source voltage terminal and the sensor bias terminal; and
   a second sensor bias resistor coupled between the sensor bias terminal and the fixed voltage node.

5. The integrated circuit amplifier of claim 1 wherein a resistance ratio between first sensor bias resistor and the second sensor bias resistor establishes the temperature set point.

6. The integrated circuit amplifier of claim 1 further comprising a diode coupled in series with the first sensor bias resistor, wherein the diode is oriented to conduct current from the voltage source terminal to the sensor bias terminal.

7. The integrated circuit amplifier of claim 6 wherein the diode is configured to provide beta compensation for the sensor transistor.

8. The integrated circuit amplifier of claim 1 further comprising a power transistor bias network coupled between the shutdown circuitry and the signal/bias input terminal.

9. The integrated circuit amplifier of claim 1 wherein the power transistor bias network comprises:
   a first power bias transistor having a first bias current terminal coupled to a current source, a first bias control terminal coupled to the first bias current terminal, and a second bias current terminal; and
   a second power bias transistor having a third bias current coupled to the second bias current terminal, a second bias control terminal coupled to the third bias current terminal and a fourth bias current terminal coupled to the fixed voltage node.

10. The integrated circuit amplifier of claim 1 wherein the shutdown circuitry comprises:

a logic inverter transistor having a logic control terminal coupled to the sensor output terminal, a first inverter terminal coupled to the voltage source terminal through a logic resistor, and a second inverter terminal coupled to the fixed voltage node; and a pull-down transistor having a pull-down control terminal coupled to the first inverter terminal, a first pull-down terminal, and a second pull-down terminal coupled to the fixed voltage node.

11. The integrated circuit amplifier of claim 1 wherein the fixed voltage node is ground.

12. Thermal protection circuitry comprising:

a sensor transistor having a sensor control terminal, a first sensor current terminal coupled to a voltage source, and a second sensor current terminal coupled to a fixed voltage node; and sensor bias circuitry having a sensor bias terminal coupled to the sensor control terminal, wherein the sensor bias circuitry is configured to generate a temperature set point at which a sensor output voltage at the first sensor current terminal drops 2 V±25% when the temperature of the sensor transistor is above the temperature set point.

13. The thermal protection circuitry of claim 12 further comprising a sensor output resistor coupled between the first sensor current terminal and the voltage source.

14. The thermal protection circuitry of claim 12 wherein the sensor transistor is a heterojunction bipolar transistor.

15. The thermal protection circuitry of claim 12 wherein the sensor bias circuitry comprises:

a first sensor bias resistor coupled between the source voltage and the sensor bias terminal; and a second sensor bias resistor coupled between the sensor bias terminal and the fixed voltage node.

16. The thermal protection circuitry of claim 15 wherein a resistance ratio between first sensor bias resistor and the second sensor bias resistor establishes the temperature set point.

17. The thermal protection circuitry of claim 12 further including a diode coupled in series with the first sensor bias resistor, wherein the diode is oriented to conduct current from the voltage source to the sensor bias terminal.

18. The thermal protection circuitry of claim 17 wherein the diode is configured to provide beta compensation for the sensor transistor.

19. The thermal protection circuitry of claim 12 further comprising a power transistor bias network coupled between the shutdown circuitry and the signal/bias input terminal.

20. The thermal protection circuitry of claim 12 wherein the power transistor bias network comprises:

a first power bias transistor having a first bias current terminal coupled to a current source, a first bias control terminal coupled to the first bias current terminal, and a second bias current terminal; and a second power bias transistor having a third bias current coupled to the second bias current terminal, a second bias control terminal coupled to the third bias current terminal and a fourth bias current terminal coupled to the fixed voltage node.

21. The thermal protection circuitry of claim 12 wherein the shutdown circuitry comprises:

a logic inverter transistor having a logic control terminal coupled to the sensor output terminal, a first inverter terminal coupled to the voltage source terminal through a logic resistor, and a second inverter terminal coupled to the fixed voltage node; and a pull-down transistor having a pull-down control terminal coupled to the first inverter terminal, a first pull-down terminal, and a second pull-down terminal coupled to the fixed voltage node.

22. The thermal protection circuitry of claim 12 wherein the fixed voltage node is ground.

* * * * *